United States Patent
Drake et al.

(10) Patent No.: US 9,369,119 B2
(45) Date of Patent: Jun. 14, 2016

(54) ADJUSTABLE DELAY CALIBRATION IN A CRITICAL PATH MONITOR

(71) Applicant: GlobalFoundries U.S. 2 LLC, Hopewell Junction, NY (US)

(72) Inventors: Alan James Drake, Austin, TX (US); Michael Stephen Floyd, Cedar Park, TX (US); Pawel Owczarczyk, Highland, NY (US); Gregory Scott Still, Raleigh, NC (US); Marshall Dale Tiner, Elgin, TX (US); Xiaobin Yuan, Carmel, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 128 days.

(21) Appl. No.: 14/058,428

(22) Filed: Oct. 21, 2013

(65) Prior Publication Data
US 2015/0109043 A1    Apr. 23, 2015

(51) Int. Cl.
*H03H 11/26* (2006.01)
*H03K 5/159* (2006.01)

(52) U.S. Cl.
CPC ..................................... *H03K 5/159* (2013.01)

(58) Field of Classification Search
CPC ... H03L 7/0814; H03L 7/0812; H03L 7/0818; H03L 7/0805; H03L 7/087; H03K 5/133; H03K 2005/00026; H03K 2005/00058; H03K 5/135; H03K 5/1565; H03K 5/131

USPC .......... 327/261, 263, 269–271, 276, 277, 284
See application file for complete search history.

(56) References Cited

U.S. PATENT DOCUMENTS

| | | | |
|---|---|---|---|
| 5,515,403 A * | 5/1996 | Sloan et al. .................. 375/371 |
| 6,628,160 B2 | 9/2003 | Lin et al. |
| 7,479,814 B1 * | 1/2009 | Kaviani et al. ............... 327/156 |
| 7,576,569 B2 | 8/2009 | Carpenter et al. |
| 7,900,165 B2 | 3/2011 | Oh et al. |
| 7,952,404 B2 * | 5/2011 | Petrie ....................... H03L 7/07 327/149 |
| 8,405,413 B2 | 3/2013 | Carpenter et al. |
| 2012/0043982 A1 * | 2/2012 | Carpenter et al. ......... 324/750.3 |
| 2013/0117589 A1 | 5/2013 | Satyamoorthy et al. |

* cited by examiner

*Primary Examiner* — Lincoln Donovan
*Assistant Examiner* — Diana J Cheng
(74) *Attorney, Agent, or Firm* — Yuanmin Cai, Esq.

(57) ABSTRACT

A critical path monitor (CPM) having a set of split paths is configured in an integrated circuit (IC) that includes a corresponding set of critical paths. A first and a second split path is configured with a first and a second simulated delay sections and fine delay sections, respectively. A delay of each of the first and second fine delay sections is adjustable in several steps. The delay of the first fine delay section is adjustable differently from the delay of the second fine delay section in response to a common operating condition change. Differently adjusting the delays of the first and the second fine delay sections causes an edge of a pulse to be synchronized between a first edge detector located after the first simulated delay section and a second edge detector located after the second simulated delay section.

20 Claims, 10 Drawing Sheets

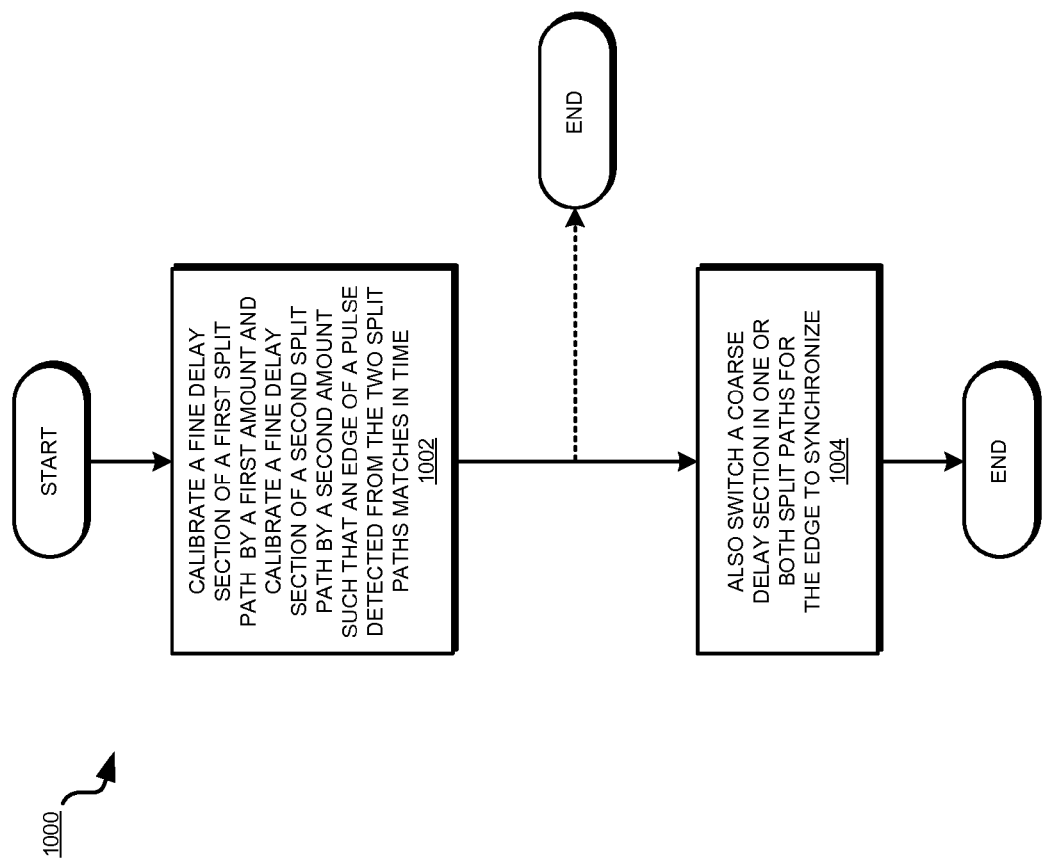

ADJUSTABLE DELAY CALIBRATION IN A CRITICAL PATH MONITOR

TECHNICAL FIELD

The present invention relates generally to a method, system, and computer program product for calibrating the operating conditions of a processor using a critical path monitor. More particularly, the present invention relates to a method, system, and computer program product for adjustable delay calibration in a critical path monitor.

BACKGROUND

Integrated circuits (ICs) are used for performing various types of operations, such as executing instructions, performing computations, storing data, and moving data. A microprocessor, or processor, is a type of integrated circuit that is commonly used in modern-day computers for performing a variety of operations, such as arithmetic, logical, and data movement operations. A processor can include one or more cores. A core in a processor is the circuitry that performs the processor's functions. Within this disclosure, the terms processor and core are used interchangeably.

The operation of an IC depends on many operating conditions, including but not limited to the voltage, frequency, temperature, type of workload, and age of the circuit. A change in one or more of the operating conditions, such as a change in the voltage, noise in the electrical environment of the IC, and other reasons can cause timing variations within an IC.

When a process uses an IC, the process uses a subset of components arranged as a part of the IC. The subset of components arranged in a particular order as used by the process is called a path. As an example, a core can include thousands if not millions of paths through the core circuitry.

A path has an associated delay. The delay is the timing delay introduced in a signal as the signal traverses the path. A critical path is a path, which when operated at above a threshold level of an operating condition, can cause the IC to fail. For example, a path may be a critical path if using the path at a higher than a threshold frequency causes the delay in the path to exceed an acceptable delay threshold. Different paths may be sensitive to different operating conditions, or different combinations of operating conditions, making those paths critical for those operating conditions.

A critical path monitor (CPM) is a monitoring circuit configured to monitor the delay in one or more critical paths. Generally, a CPM simulates the one or more critical paths and provides information regarding the critical path delay by subjecting the simulated paths to operating conditions similar to the operating conditions experienced by the critical path in the IC.

An IC usually has a control component, which controls an operating condition of an IC. For example, a clock provides the operating frequency, and can be adjusted for changing the operating frequency of the IC. A voltage regulator similarly regulates the voltage at which the IC or a part thereof operates.

A feedback loop between a CPM and a control component allows a control component to adjust the corresponding operating condition based on CPM calibrations. A calibration is the process of altering a value or a characteristic of a simulated path in the CPM. Typically, the calibration adjusts the delay of a simulated path in the CPM to achieve an acceptable delay in the simulated path. The calibration adjustment in turn informs a control component about an amount of adjustment needed in the operating condition to achieve a similarly desirable delay in the critical path in the IC.

SUMMARY

The illustrative embodiments provide a method, system, and computer program product for adjustable delay calibration in a critical path monitor. An embodiment configures, in an integrated circuit (IC), the CPM, wherein the IC includes a set of critical paths, wherein the CPM includes a set of split paths, a split path in the set of split paths corresponding to a critical path in the set of critical paths. The embodiment configures, in a first split path in the set of split paths, a first simulated delay section and a first fine delay section. The embodiment configures, in a second split path in the set of split paths, a second simulated delay section and a second fine delay section. The embodiment configures the first fine delay section such that a delay of the first fine delay section is adjustable in several steps. The embodiment configures the second fine delay section such that a delay of the second fine delay section is adjustable in several steps, wherein the delay of the first fine delay section is adjustable differently from the delay of the second fine delay section in response to a common operating condition change, and wherein differently adjusting the delay of the first fine delay section and the delay of the second fine delay section causes an edge of a pulse to be synchronized between a first edge detector located after the first simulated delay section and a second edge detector located after the second simulated delay section.

Another embodiment includes a computer usable program product comprising a computer usable storage device including computer usable code for adjustable delay calibration in a critical path monitor (CPM). The embodiment further includes computer usable code for configuring, in an integrated circuit (IC), the CPM, wherein the IC includes a set of critical paths, wherein the CPM includes a set of split paths, a split path in the set of split paths corresponding to a critical path in the set of critical paths. The embodiment further includes computer usable code for configuring, in a first split path in the set of split paths, a first simulated delay section and a first fine delay section. The embodiment further includes computer usable code for configuring, in a second split path in the set of split paths, a second simulated delay section and a second fine delay section. The embodiment further includes computer usable code for configuring the first fine delay section such that a delay of the first fine delay section is adjustable in several steps. The embodiment further includes computer usable code for configuring the second fine delay section such that a delay of the second fine delay section is adjustable in several steps, wherein the delay of the first fine delay section is adjustable differently from the delay of the second fine delay section in response to a common operating condition change, and wherein differently adjusting the delay of the first fine delay section and the delay of the second fine delay section causes an edge of a pulse to be synchronized between a first edge detector located after the first simulated delay section and a second edge detector located after the second simulated delay section.

Another embodiment includes a critical path monitor (CPM) apparatus with adjustable delay calibration in an integrated circuit (IC). The embodiment further includes a set of split paths, a split path in the set of split paths comprising hardware components and corresponding to a critical path in a set of critical paths in the IC. The embodiment further includes a first simulated delay section and a first fine delay section in a first split path in the set of split paths. The embodiment further includes a second simulated delay section and a second fine delay section in a second split path in the set of split paths. The embodiment further includes a configuration in the first fine delay section such that a delay of the first fine delay section is adjustable in several steps. The embodiment further includes a configuration the second fine delay section such that a delay of the second fine delay section is adjustable in several steps, wherein the delay of the first fine delay section is adjustable differently from the delay of the second fine delay section in response to a common operating condition change, and wherein differently adjusting the delay of the first fine delay section and the delay of the second fine delay section causes an edge of a pulse to be synchronized between a first edge detector located after the first simulated delay section and a second edge detector located after the second simulated delay section.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 10 depicts a flowchart of an example process for calibrating a delay in a split path in accordance with an illustrative embodiment.

DETAILED DESCRIPTION

Figure 1:
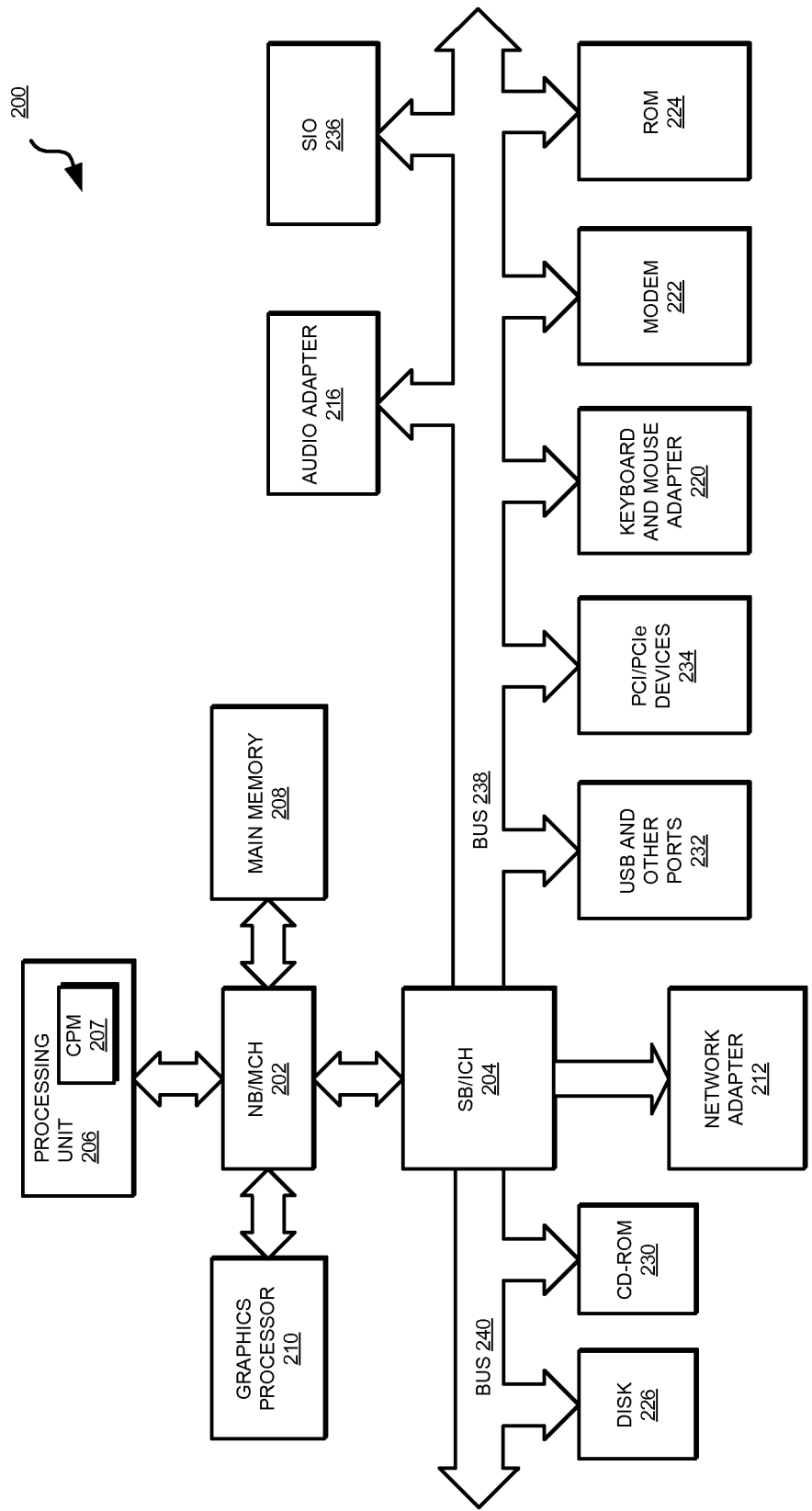
FIG. 1 depicts a block diagram of a data processing system in which illustrative embodiments may be implemented.

The illustrative embodiments recognize that presently used CPMs suffer from certain undesirable traits that prevent achieving optimum operating conditions in an IC. The illustrative embodiments recognize that presently, a change or an adjustment applied in a CPM applies to all simulated paths in the CPM.

For example, the illustrative embodiments recognize that different critical paths are sensitive to different operating conditions. For example, the delay of one critical path may be sensitive to temperature whereas the delay of another critical path may be sensitive to voltage variations. When a temperature change adversely affects the first critical path's delay, a presently used CPM applies a frequency change to the simulated paths. However, a frequency change to reduce the power consumption of the IC, to reduce the temperature, and in turn to reduce the delay in the first critical path may inadvertently cause the delay of the second critical path to become unacceptable.

As another example, suppose that two paths in the CPM have different sensitivities to the same operating condition, e.g., voltage. For example, path 1 has a sensitivity of 1 unit of measure to voltage change, whereas path 2 has a sensitivity of 4 units of measure to voltage change. The illustrative embodiments recognize that under such commonly found scenario, a one percent calibration in the voltage will result in different changes in the delays of paths 1 and 2. For example, path 2 might exhibit four times the delay change as compared to the delay change of path 1. Thus, the illustrative embodiments further recognize that calibrating granularity of the different paths is not individually controllable for each path in the presently available CPM.

The illustrative embodiments used to describe the invention generally address and solve the above-described problems and other problems related to calibrating a CPM. The illustrative embodiments provide a method, system, and computer program product for adjustable delay calibration in a critical path monitor.

An embodiment provides a fine delay section in each simulated path of a modified CPM. A simulated path in a modified or improved CPM, implementing a fine delay section and an edge detector in conjunction with one or more simulated paths according to an embodiment, is referred to as a split path within this disclosure.

The fine delay section of a split path is controllable for adjusting the delay in that split path separately from the delay change that occurs in the split path due to an operating condition change. The delay of each split path is independently adjustable using the corresponding fine delay section of that path. Thus, for example, when an operating condition causes a desired level of change in the delay of one split path but an undesirable level of change in the delay of another split path, the undesirable amount of delay can be tuned or adjusted in the split path using the fine delay section of that delay path.

An embodiment further provides a configuration for selecting one or more split paths for participating in a calibration exercise. For example, assume that split paths 1 and 3 are known to be sensitive to voltage changes above a threshold, and split paths 2 and 4 are known to be sensitive to voltage changes below the threshold. Further assume that at a given time, the CPM is responding to a condition of a voltage change above the threshold in the IC. Accordingly, the embodiment allows a path selection operation whereby only split paths 1 and 3 are calibrated. Such an operation affords faster adjustment of the operating condition in the IC, and avoids unnecessary adjustments to critical paths that are unaffected by the operating condition change in the IC.

An embodiment further provides independent coarse delay adjustments in the split paths. For example, under certain circumstances, the calibration has to occur over a large range, for example, from down to one half of a frequency value up to twice or more of the frequency value. Fabricating the fine delay section to cover such large ranges of calibrations that is also capable of providing fine-grained delay adjustments of 1% or less would occupy a significant amount of space on the IC. So, the embodiment uses independent coarse calibration of the delay in a split path to approximate the adjustment needed in that split path. Thereafter, the embodiment uses the fine delay calibration of another embodiment to achieve the needed delay adjustment in that split path.

The fine delay section of each split path is adjustable independently of the adjustments to the delays of other split paths in the CPM. In one embodiment, the split path comprises several switchable delay sections that can be turned on or off in the split path as a way of achieving the coarse calibration. The coarse delay section of the split path provides the switching functionality for such switchable delay sections. To maintain the unique sensitivity of the path to environmental changes, the coarse delay sections must be composed of components whose delay sensitivity matches that of the overall path within a threshold degree.

The illustrative embodiments are described with respect to certain integrated circuits, components, data processing systems, environments, components, and applications only as examples. Any specific manifestations of such artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to the figures and in particular with reference to FIG. 1, this figure is an example diagram of a data processing environment in which illustrative embodiments may be implemented. FIG. 1 is only an example and is not intended to assert or imply any limitation with regard to the environments in which different embodiments may be implemented. A particular implementation may make many modifications to the depicted environments based on the following description.

With reference to FIG. 1, this figure depicts a block diagram of a data processing system in which illustrative embodiments may be implemented. Data processing system 200 is an example of a computer, or another type of device in which computer usable program code or instructions implementing the processes may be located for the illustrative embodiments.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. CPM 207 in processing unit 206 may be one or more CPMs in which an embodiment is implemented. CPM 207 is depicted in processing unit 206 only as an example without implying a limitation thereto. CPM 207 can be implemented in other IC's such as in graphics processor 210 or memory 208. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as the instructions to execute a process according to an embodiment described herein, are located on storage devices, such as hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as modem 222 or network adapter 212. A memory may be, for example, main memory 208 or a cache, such as the cache found in North Bridge and memory controller hub 202. A processing unit may include one or more processors or CPUs.

The depicted examples in FIG. 1 and above-described examples are not meant to imply architectural limitations. For example, data processing system 200 also may be a tablet computer, laptop computer, or telephone device in addition to taking the form of a PDA.

Figure 2:
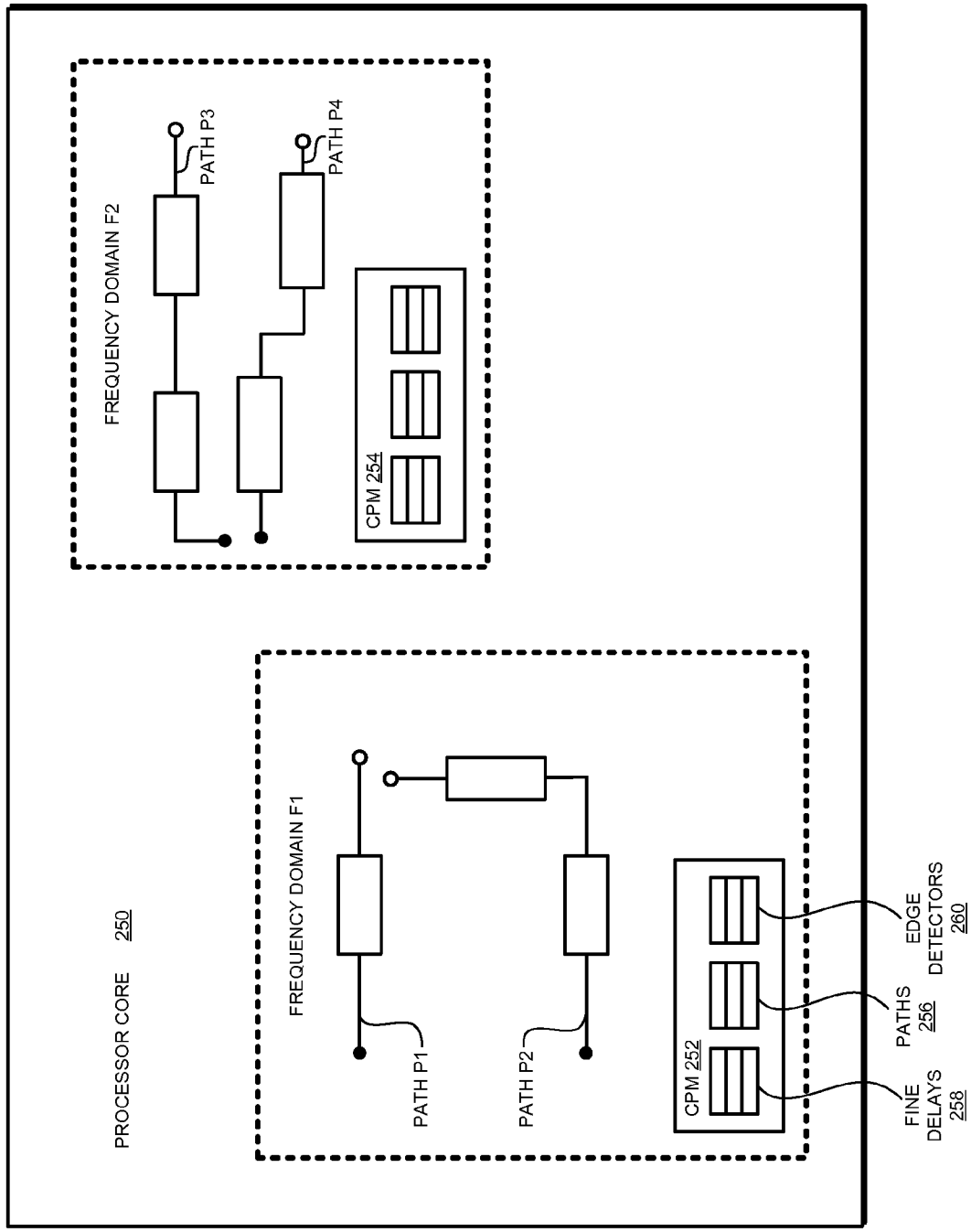
FIG. 2 depicts a block diagram of a processing unit having critical path monitors in accordance with an illustrative embodiment.

With reference to FIG. 2, processor core 250 is an example of processing unit 206 in FIG. 1. Applicability of an embodiment is depicted and described with respect to a processor core, such as processor core 250, only as an example and without implying a limitation thereto.

A frequency domain is an area of an IC, such as an area of core 250, that operate at a certain operating frequency. For example, under certain circumstances, frequency domain F1 may be operating at the clock frequency and frequency domain F2 may be operating at half the clock frequency.

Paths P1 and P2 are two examples of many critical paths in frequency domain F1. Similarly, paths P3 and P4 are two examples of many critical paths in frequency domain F2.

CPM 252 and 254 are each improved CPMs that implement an embodiment described herein. CPM 252 simulates the delays of paths P1 and P2, and any number of other critical paths. CPM 252 is located proximate to paths P1 and P2 on the die of core 250 such that the split paths in CPM 252 experience similar operating conditions as paths P1 and P2. CPM 254 simulates the delays of paths P3 and P4, and any number of other critical paths. CPM 254 is located proximate to paths P3 and P4 on the die of core 250 such that the split paths in CPM 254 experience similar operating conditions as paths P3 and P4.

Improved CPM 252 includes split paths 256 according to an embodiment. CPM 252 includes fine delays 258, such that one fine delay in fine delays 258 corresponds to one split path in split paths 256. Improved CPM 252 includes edge detectors 260, such that one edge detector in edge detectors 260 corresponds to one split path in split paths 256. CPM 254 includes split paths, corresponding fine delays, and edge detectors in a similar manner.

Figure 3:
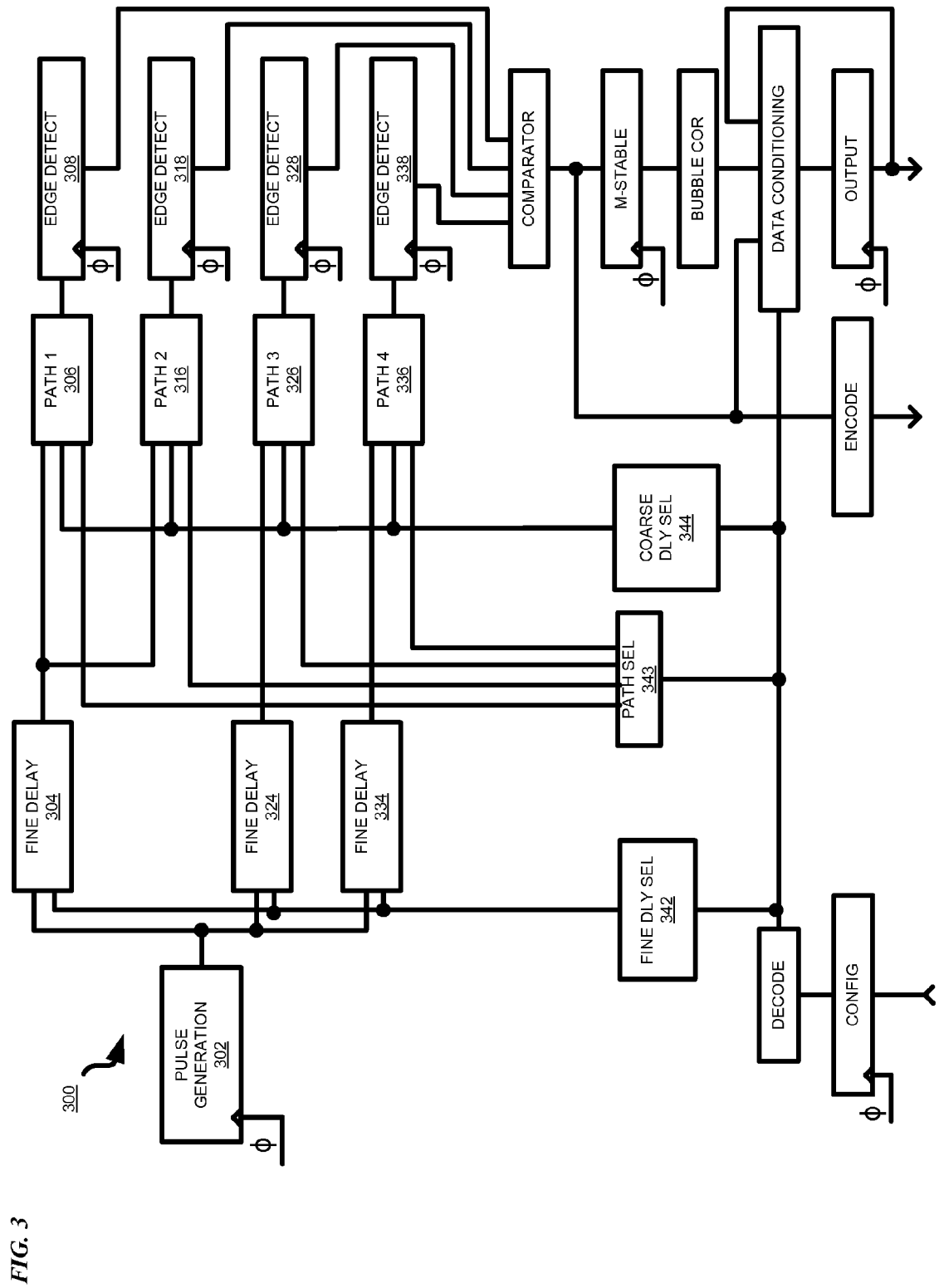
FIG. 3 depicts an example configuration for adjustable delay calibration in a critical path monitor in accordance with an illustrative embodiment.

With reference to FIG. 3, this figure depicts another example configuration for adjustable delay calibration in a critical path monitor in accordance with an illustrative embodiment. Configuration 300 can be implemented in CPM 252 in FIG. 2.

Pulse generation component 302 generates a clock pulse at a certain frequency. The pulse passes through one or more split paths in configuration 300 to reach the edge detectors in those split paths. The time at which an edge detector in a split path detects the edge of the pulse corresponds to the delay in that split path. The total delay of a split path is similar to the total delay of the critical path in the IC that the split path simulates. Furthermore, a sensitivity of the delay, such as to a changing operating condition, of a split path is similar, such as within a threshold tolerance limit, to a sensitivity of the delay of corresponding critical path to the changing operating condition.

Only as an example and without implying any limitation thereto, configuration 300 depicts four example split paths. In some cases, such as when the split paths have similar delay sensitivities to one another, a fine delay section is sharable across more than one split paths. For example, a first split path includes fine delay section 304, simulated path 306 labeled "Path 1," and edge detector 308. A second split path shares fine delay section 304, and includes simulated path 316 labeled "Path 2" and edge detector 318.

Some or all split paths can also be configured with separate fine delay sections, such as when the split paths have different delay sensitivities. For example, a third split path includes fine delay section 324, simulated path 326 labeled "Path 3," and edge detector 328. A fourth split path includes fine delay section 334, simulated path 336 labeled "Path 4," and edge detector 338.

Each fine delay section uses components that have similar delay sensitivity as the components used in the corresponding simulated path. Such a configuration results in a fine delay section sensitivity that is similar to the sensitivity of the corresponding simulated path. The fine delay section also includes a reference delay block that determines the size of adjustment when the delay setting changes. This reference delay has a common configuration in the fine delay sections of the different simulated paths. Configured in this manner, a fine delay section allows controlling how a calibration adjustment applies to the total delay in a split path while still allowing maximum consistency in sensitivity to environmental factors within a single split path. For example, if a one percent change in frequency is applied at pulse generation component 302 and all paths have a one percent reference step change, fine delay section 304 can be calibrated independently from fine delay sections 324 and 334, to ensure that edge detectors 308, 318, 328, and 338 all detect the one percent change in the edge of the changed frequency pulse at the same time. In other words, each of fine delay sections 304, 324, and 334 is independently tunable with consistent accuracy to ensure that the calibration introduces no relative delay in the split paths. But since each path has different sensitivity to operating conditions except for the common reference, each path will independently track operating condition changes according to path sensitivity. The multiple paths can be selected independently or in combination to match the sensitivity of the actual critical paths.

Fine delay selection component 342 sends one or more suitable signals to fine delay sections 304, 324, and 334. Using a signal from component 342, a fine delay section, for example, fine delay section 324, can determine an amount of calibration to apply such that edge detection at edge detector 328 is synchronized with edge detection at edge detector 308, 318, or 338. Each of fine delay sections 304, 324, and 334 is independently tunable in a similar manner. Independent tuning is useful when control structures using CPMs require a constant edge detector value at baseline operating conditions for all paths. The differences that develop between paths after calibration are then used to determine system response to changing environmental conditions.

In another embodiment, all fine delay sections 304, 324, and 334 receive the same calibration signals from fine delay selection component 342 and are not independently tunable. This embodiment is useful when it is not desirable to calibrate out differences between paths, such as when trying to measure actual processing differences between the paths and the slowest processed path is expected to dominate the delay. This embodiment may be useful when space constraints on a die do not allow for independent control signals.

Path selection component 343 sends one or more suitable signals to simulated paths 306, 316, 326, and 336. Using a signal from path selection component 343, a simulated path, for example, simulated path 326, can be turned on or turned off. In effect, each of simulated paths 306, 316, 326, and 336 is independently includable or excludable from a calibration exercise.

Simulated paths 306, 316, 326, and 336 also include a coarse delay section. In one embodiment, a simulated path is fabricated as a series of smaller delay components, and all the smaller delay components together contribute the total delay of the simulated path. In an example implementation of such an embodiment, simulated path 306 comprises n delay components of 1/n total delay of simulated path 306.

In another embodiment, a coarse delay section (not shown) can be added before, after, or in between a simulated path. In an example implementation of such an embodiment, a coarse delay section is introduced between fine delay section 304 and simulated path 306.

Depending on how coarse delay is implemented in a split path, coarse delay selection component 344 sends one or more suitable signals to simulated paths 306, 316, 326, and 336, or to coarse delay sections operating in conjunction therewith. Using a signal from coarse delay selection component 344, a coarse delay section, or a delay component in a simulated path, for example, a delay component in simulated path 326, can be turned On or Off to include or exclude the delay component in the total delay of the split path. Operating in this manner, the total delay of a split path is coarsely calibrated independent of other split paths. In another embodiment, all paths receive the same coarse delay control and are not independently calibrated. This embodiment may be used when space constraints limit the number of control signals. In this embodiment, the fine delay is used to adjust the differences between paths or the differences may be used to represent processing differences between paths.

Figure 4:
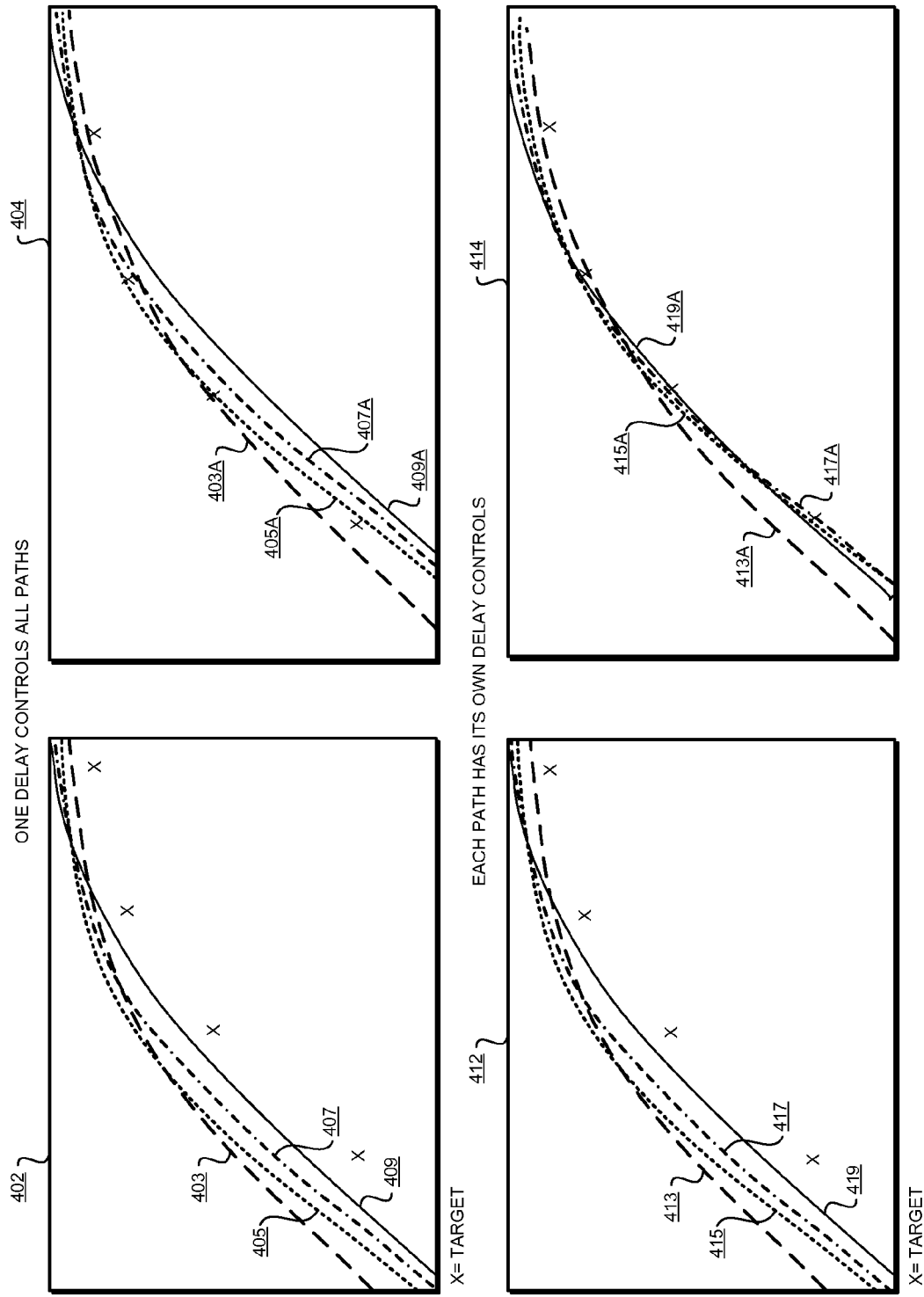
FIG. 4 depicts comparative graphs of an effect of calibrating a prior art CPM and an effect of adjustable delay calibration in a critical path monitor in accordance with an illustrative embodiment.

With reference to FIG. 4, this figure depicts comparative graphs of an effect of calibrating a prior art CPM and an effect of adjustable delay calibration in a critical path monitor in accordance with an illustrative embodiment. Graphs 402 and 404 show the before and after results of calibrating an embodiment of the CPM with common control for all fine delay calibration elements. Graph 402 shows the delay characteristics of four example simulated paths using curves 403, 405, 407, and 409. As an example, curves 403, 405, 407, and 409 are achieved by varying a voltage along the X-axis and plotting a frequency change, which is the inverse of delay, along the Y-axis. The points marked as "x" show a target delay characteristic to be obtained via a delay calibration of the simulated paths.

As is evident from graph 402, such as by observing the graph portions in the lower half of the voltage range on the X-axis, a larger change is required to bring curve 403 closer to the target delay characteristic as compared to the change required for bringing curve 409 closer to the target delay characteristic. In a CPM where a single delay calibration applies to all simulated paths, graph 404 shows the results. When a single delay calibration or adjustment is applied to all four simulated paths, all four curves shift to their positions depicted by curves 403A, 405A, 407A, and 409A.

In the prior art, all paths share the same calibration delay. This manner of calibrating reduces the sensitivity differences between paths and makes it difficult to match multiple paths to the target sensitivities marked by "x" in graph 402. In contrast, an embodiment, such as in FIG. 3, has calibration delay blocks 304, 324, 334 whose characteristics match the path characteristics for increased sensitivity and greater slope differences as shown by curves 403A, 405A, 407A, and 409A. When all four simulated paths share the same delay setting, then a delay calibration has similar effect on all four graphs. Because of the same delay adjustment applied to all four simulated paths, all four curves have moved by a similar amount on graph 404. But, while curve 403A has approached the target "x" points, disadvantageously, curve 409A has passed beyond them, as also have curves 407A and 405A to some extent. For this embodiment, calibration will select the path combination that gets closest to the "x" path. Variation differences result in offset to the real path, but the differences represent real process differences. In an application where measurement of those differences is important, the slower path type will dominate similar to the real circuit and the faster paths can be safely ignored. Such an embodiment is useful where fabrication space is at a premium since processing will push the faster paths out of the way naturally and only the slow path will be monitored.

Graphs 412 and 414 show the before and after results of calibrating a CPM according to an embodiment, such as a CPM including configuration 300 of FIG. 3 but where each of the fine delays 304, 324, and 334 have independent delay settings. Graph 412 is similar to graph 402 and shows the delay characteristics of four example split paths, implemented in another embodiment CPM with independent delay control for each path, using curves 413, 415, 417, and 419. As in the case of graph 402, curves 413, 415, 417, and 419 are achieved by varying a voltage along the X-axis and plotting a frequency change, which is the inverse of delay, along the Y-axis. The points marked as "x" show a target delay characteristic to be obtained via a delay calibration of the simulated paths.

In an improved CPM, where delay calibrations are independently adjustable for each split path, graph 414 shows the results. When different delay calibrations or adjustments are applied to each of the four split paths, the four curves shift to their positions depicted by curves 413A, 415A, 417A, and 419A.

Again, for the simplicity of the depiction, all four simulated paths are assumed to have similar calibration delay adjustment step sizes, but different calibration delay settings. As a result, different delay calibrations have different effects on each of the four graphs. Curves 415A, 417A, and 419A have approached the target "x" points, as has curve 413A, without overshooting the "x" points. In this embodiment the accuracy of the calibration for all paths is increased, but the effects of process variation are removed and the embodiment requires more area to accommodate the extra control signals.

Figure 5:
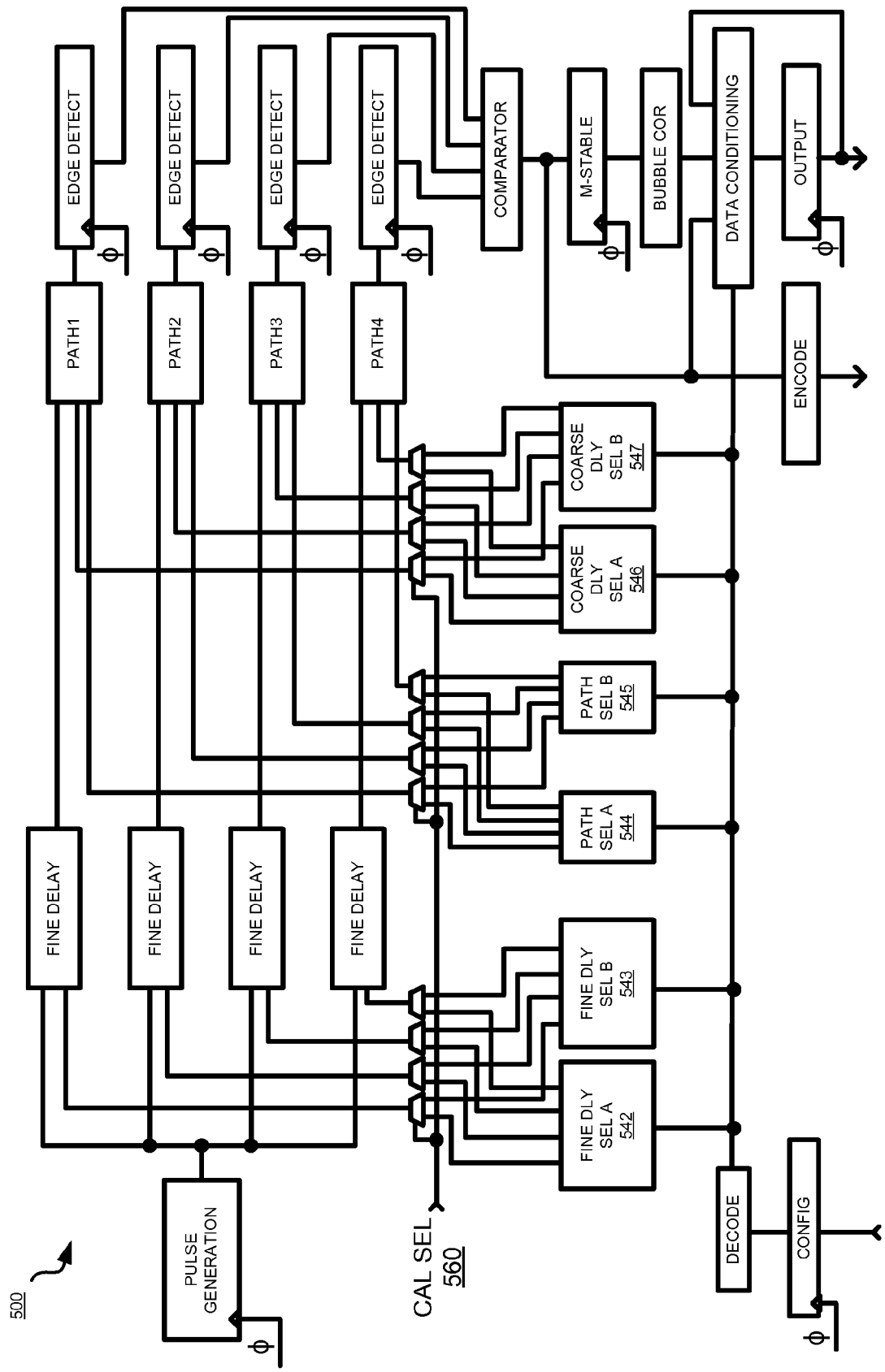
FIG. 5 depicts a modified configuration for adjustable delay calibration in a critical path monitor in accordance with an illustrative embodiment.

With reference to FIG. 5, this figure depicts a modified configuration for adjustable delay calibration in a critical path monitor in accordance with an illustrative embodiment. Configuration 500 is a modification of configuration 300 in FIG. 3.

In configuration 500, as different from configuration 300 in FIG. 3, more than one fine delay selection can be applied to a split path. For example, whereas in configuration 300, only one fine delay selection component 342 provides a signal to the fine delay sections of the split paths, configuration 500 allows for selecting any one of the several fine delay selection components to provide such a signal.

Such an embodiment is useful, for example, when more than one type of delay calibrations is to be applied in response to more than one type of operating condition change. Different instances of the fine delay selection components, such as fine delay selection component 542 or 543, can be used to provide such differing signals.

Such an embodiment is also useful, for example, when different responses are expected from a given fine delay section in a split path in response to different signals. Different instances of the fine delay selection components, such as fine delay selection components 542 and 543 can generate such different signals.

Path selection components 544 and 545 operate in a similar manner as path selection component 343 in FIG. 3. Each of path selection components 544 and 545 operates to select different path combinations for similar reasons as fine delay selection components 542 and 543.

Coarse delay selection components 546 and 547 operate in a similar manner as coarse delay selection component 344 in FIG. 3. Each of coarse delay selection components 546 and 547 operates to make different coarse delay adjustments in the split paths for similar reasons as fine delay selection components 542 and 543.

Calibration selection signal 560 operates to select which one of fine delay selection components 542 and 543, which one of two path selection components 544 and 545, and which one of two coarse delay selection components 546 and 547 operate on the split paths. For example, one value of signal 560 selects fine delay selection component 542, path selection component 544, and coarse delay selection component 546, another value selects fine delay selection component 543, path selection component 545, and coarse delay selection component 547, and another value selects a different combination thereof.

While only two fine delay selection components 542 and 543, two path selection components 544 and 545, and two coarse delay selection components 546 and 547 are depicted, such depiction is not intended to be limiting. Any number of fine delay selection components, path selection components, and coarse delay selection components can similarly be used for similar purposes in configuration 500 within the scope of the illustrative embodiments.

Similarly, only one calibration selection signal 560 is depicted only as an example and not as a limitation. An implementation may use one calibration selection signal 560 for selecting between the fine delay selection components, another signal (not shown) to select between the path selection components, coarse delay selection components, or both.

Figure 6:
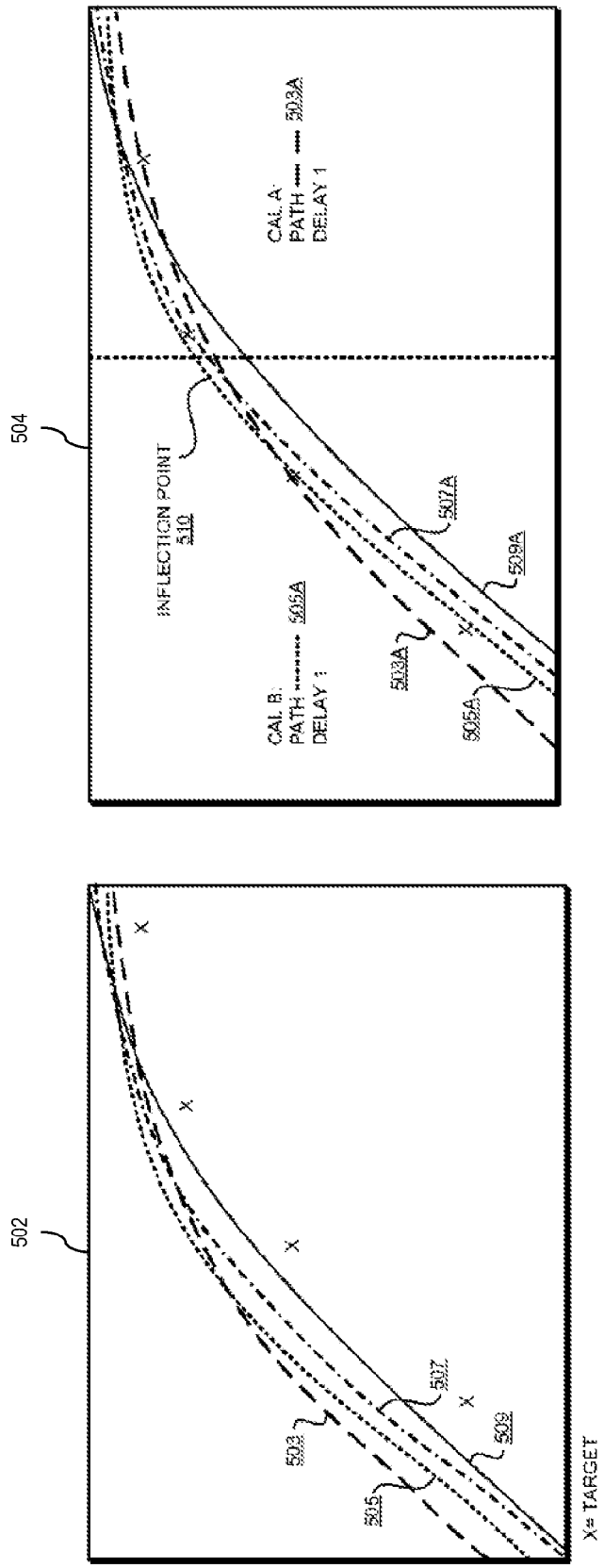
FIG. 6 depicts a graph of an effect of adjustable delay calibration in a critical path monitor in accordance with an illustrative embodiment.

With reference to FIG. 6, this figure depicts a graph of an effect of adjustable delay calibration in a critical path monitor in accordance with an illustrative embodiment. Graphs 502 and 504 show the before and after results of calibrating an improved CPM, such as a CPM implementing configuration 500 of FIG. 5. Graph 502 shows the delay characteristics of four example split paths, implemented in the improved CPM, using curves 503, 505, 507, and 509. Again, as an example, curves 503, 505, 507, and 509 are achieved by varying a voltage along the X-axis and plotting a frequency change along the Y-axis. The points marked as "x" show a target delay characteristic to be obtained via a delay calibration of the simulated paths.

In an improved CPM, where different selection components are selected using a calibration selection signal, such as selecting between fine delay selection components 542 and 543, path selection components 544 and 545, and coarse delay selection components 546 and 547, using calibration selection signal 560 in FIG. 5, delay calibrations are independently adjustable to achieve precise results as depicted in graph 504. For example the improved CPM can achieve an inflection in curves 503A and 505A at inflection point 510 as shown using such selection capabilities.

Figure 7:
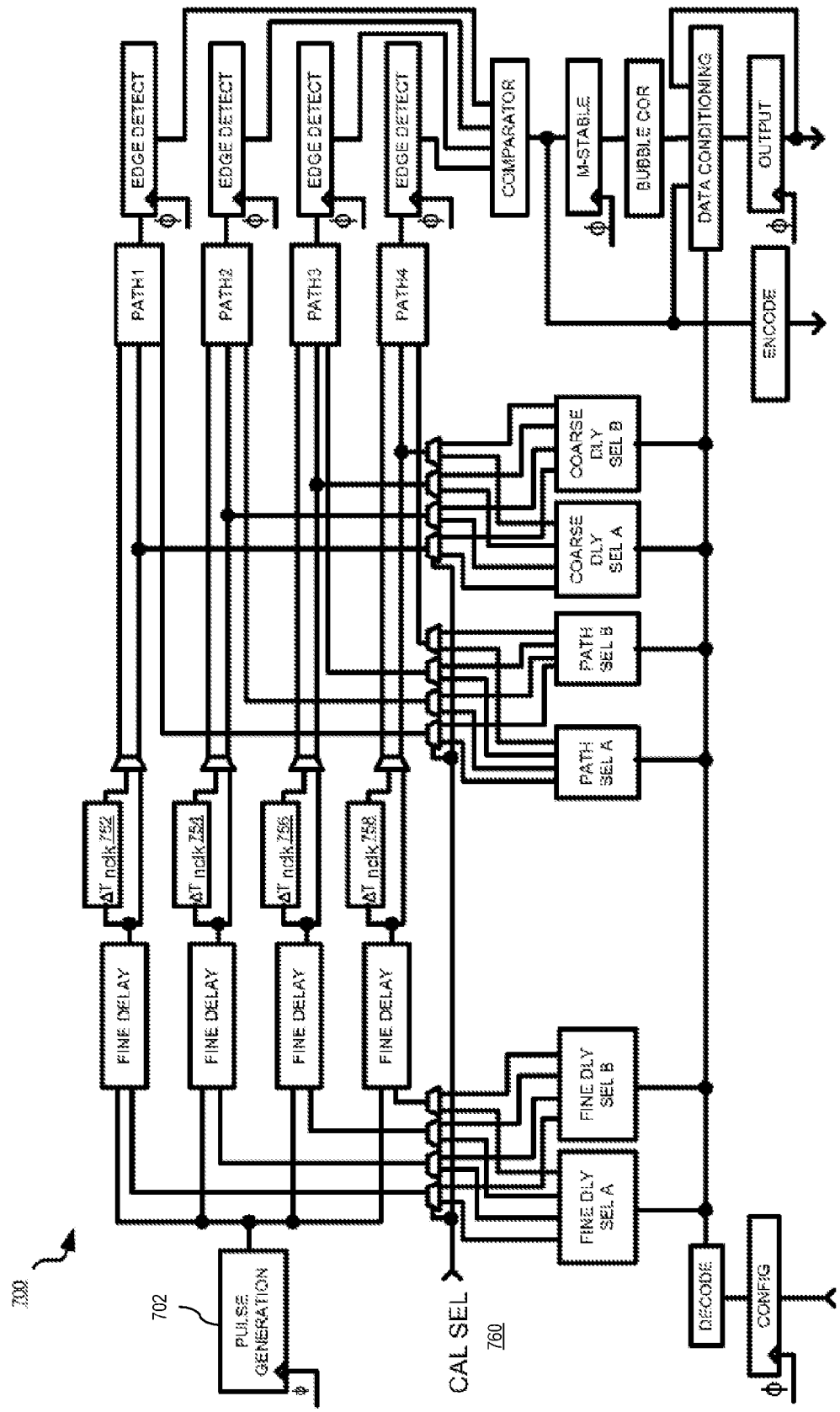
FIG. 7 depicts another modified configuration for adjustable delay calibration in a critical path monitor in accordance with an illustrative embodiment.

With reference to FIG. 7, this figure depicts another modified configuration for adjustable delay calibration in a critical path monitor in accordance with an illustrative embodiment. Configuration 700 is a modification of configuration 500 in FIG. 5.

In configuration 700, as different from configuration 300 in FIG. 3 or configuration 500 in FIG. 5, the simulated paths can be operated at differing frequencies instead of only at the frequency of the pulse generated by pulse generation component 702. A frequency altering component can be applied to a split path. For example, configuration 700 introduces frequency altering components 752, 754, 756, and 758 prior to simulated paths "path 1", "path 2", "path 3", and "path 4" respectively. A frequency altering component, such as component 752, can be configured to match a frequency in use in a given frequency domain, such as in frequency domain F1 in FIG. 2, where the improved CPM including an embodiment is deployed.

Such an embodiment is useful, for example, when more than one frequency domains exist in an IC, and similar path delays have to be simulated for the various frequency domains. For example, in one example implementation, one instance of configuration 700 allows the simulated paths to operate at the frequency of pulse generation component 702, and another instance of configuration 700 operates the simulated paths at a fraction of the pulse frequency, for example at one half of the pulse frequency.

Another embodiment of configuration 700 has one path, such as the path including frequency altering component 752 (752) operate at one frequency, f, while another path, such as the path including frequency altering component 754 operates at that frequency divided by an integer value, f/n. In one embodiment, a separate pulse generator 702 is used for each separate path, for example, one pulse generator generating a pulse at frequency f and another pulse generator generating the pulse at frequency f/n. The additional delay in the path including frequency altering component 754 would have to equal the delay added by operating at the reduced frequency. If both paths use the same elements (so that they would have the same sensitivity if operated at the same frequency) then operating the path including frequency altering component 754 at f/n increases its sensitivity by n. Thus, in such an embodiment, the range of sensitivity of paths is increased by changing the operating delay of the path to an integer multiple of the base delay.

The modifications of configuration 700 are depicted over configuration 500 of FIG. 5 only as an example, and not to imply a limitation. In one embodiment, the frequency altering modifications of configuration 700 can be applied to configuration 300 of FIG. 3 within the scope of the illustrative embodiments.

Figure 8:
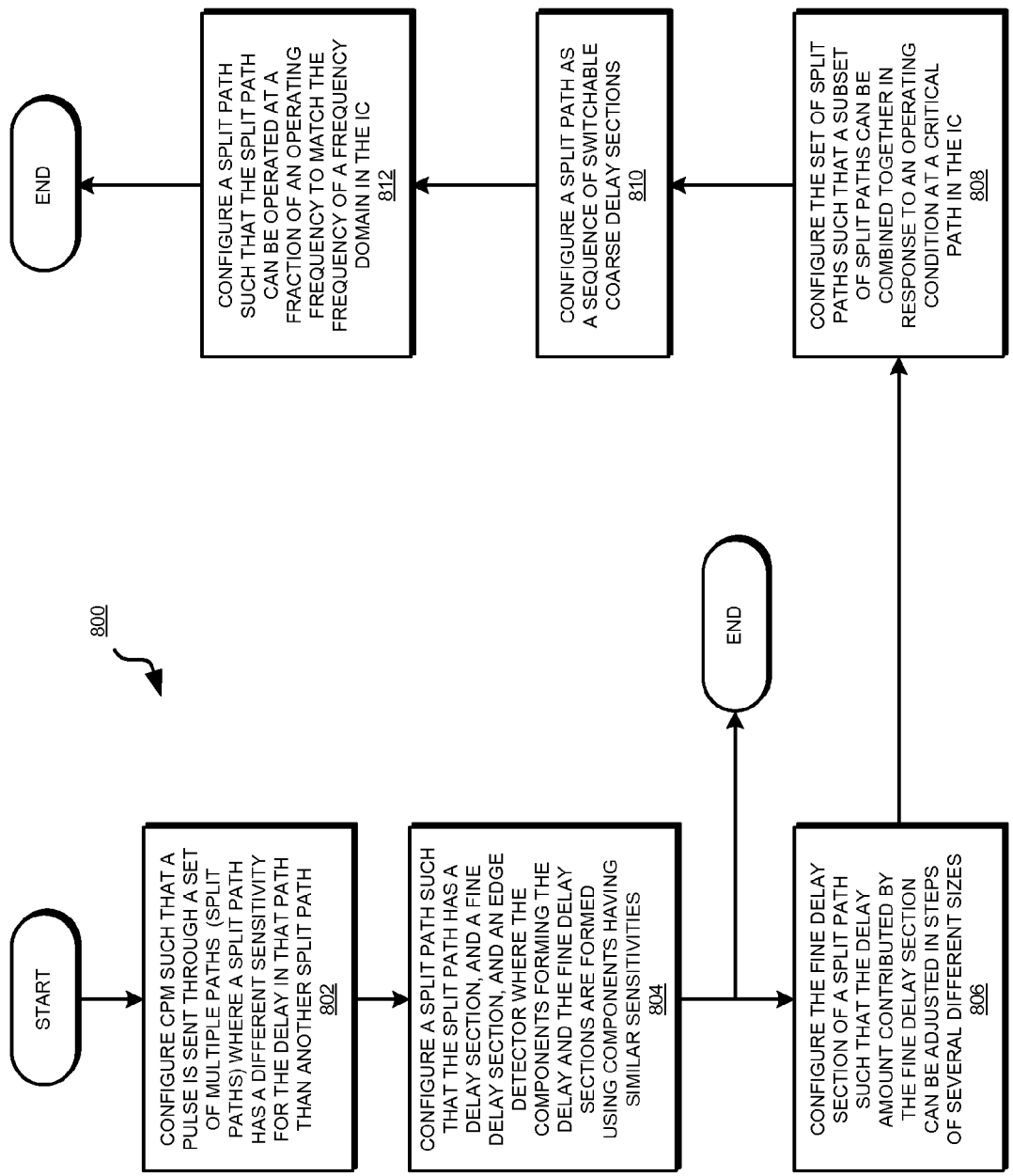
FIG. 8 depicts a flowchart of a process of configuring a CPM for adjustable delay calibration in accordance with an illustrative embodiment.

With reference to FIG. 8, this figure depicts a flowchart of a process of configuring a CPM for adjustable delay calibration in accordance with an illustrative embodiment. Process 800 can be implemented in an IC fabrication process to fabricate an improved CPM on the die of an IC, such as to fabricate improved CPM 252 of FIG. 2.

Process 800 configures the CPM such that a pulse can be sent through a set of multiple paths, the split paths according to an embodiment, where one split path has a different sensitivity for the delay in that split path as compared to the sensitivity for the delay in another split path in the CPM (block 802). Process 800 further configures a split path in the CPM such that the split path has a simulated delay section, a fine delay section, and an edge detector, where the components forming the simulated delay section and the fine delay section of a split path have similar delay sensitivities (block 804). Some or all split paths in the CPM can be configured in the manner of block 804. In one embodiment, process 800 may end thereafter.

In another embodiment, process 800 further configures the fine delay section of a split path such that the delay amount contributed by the fine delay section can be adjusted in steps of several different sizes (block 806). In one embodiment, the different sizes are implemented by using different reference delay blocks. In another embodiment, the different sizes are implemented by setting each fine delay section differently.

In one embodiment, different values of a signal from a fine delay selection component, such as fine delay selection component 342 in FIG. 3, can be configured to achieve the operation specified in block 806. In another embodiment, different fine delay selection components can be selected via a calibration selection signal 560 or 760, as in FIGS. 5 and 7, to achieve the operation specified in block 806.

Process 800 configures the set of split paths such that a subset of the split paths can be combined or operated together in response to an operating condition at a critical path in the IC (block 808). In one embodiment, process 800 also configures a split path as a sequence or series of switchable coarse delay sections (block 810).

Process 800 configures a split path such that the split path can be operated at a fraction of an operating frequency to match the frequency of a frequency domain in the IC (block 812). Process 800 ends thereafter.

Figure 9:
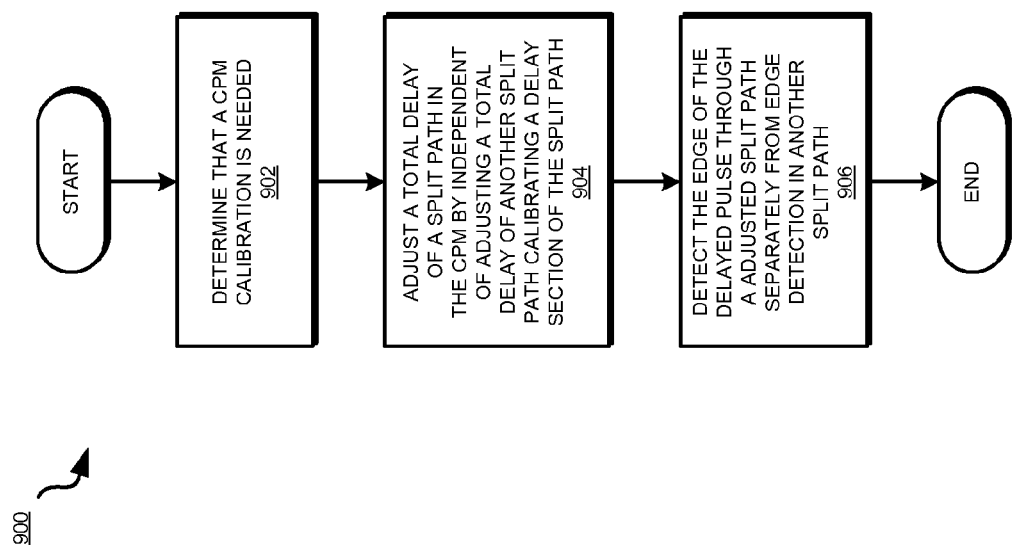
FIG. 9 depicts a flowchart of a process of adjustable delay calibration in a critical path monitor in accordance with an illustrative embodiment.

With reference to FIG. 9, this figure depicts a flowchart of a process of adjustable delay calibration in a critical path monitor in accordance with an illustrative embodiment. Process 900 can be implemented in an improved CPM, such as in improved CPM 252 in FIG. 2 using any of configurations 300, 500, or 700 in FIG. 3, 5, or 7, respectively.

The CPM determines that a calibration in the CPM is needed (block 902). For example, a change in the operating condition of a critical path may trigger a CPM calibration in an example implementation.

The CPM adjusts a total delay of a split path by calibrating the split path delay independently of adjusting a total delay of another split path in the CPM (block 904). The CPM detects the edge of a delayed pulse through an adjusted split path independently of the edge detection in another split path (block 906). The CPM ends process 900 thereafter, or performs additional CPM functions, such as providing a calibration feedback to a control component of the IC, iterating process 900 for another calibration, or another CPM.

With reference to FIG. 10, this figure depicts a flowchart of an example process for calibrating a delay in a split path in accordance with an illustrative embodiment. Process 1000 can be implemented in an improved CPM, such as CPM 252 in FIG. 2, using any of configurations 300, 500 or 700 in FIG. 3, 5, or 7, respectively.

The CPM calibrates a fine delay of a first split path by a first amount and calibrates a fine delay of a second split path by a second amount such that an edge of a common pulse passed and detected through the calibrated first and second split paths matches in time, or are synchronized within a tolerance limit (block 1002). In one embodiment, the CPM may end process 1000 thereafter.

In another embodiment, the CPM also switches a coarse delay section in one or both split paths for the end to synchronize within the tolerance limit (block 1004). The CPM ends process 1000 thereafter, or performs additional CPM functions not depicted here.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for adjustable delay calibration in a critical path monitor.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable storage medium. A computer readable storage device may be, for example, but not limited to, an electronic, magnetic, optical, electromagnetic, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can store a program for use by or in connection with an instruction execution system, apparatus, or device. The term "computer readable storage device," or variations thereof, does not encompass a signal propagation media such as a copper cable, optical fiber or wireless transmission media.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
configuring, in an integrated circuit (IC), a critical path monitor (CPM), the IC including a set of critical paths, and the CPM including a set of split paths, a split path in the set of split paths corresponding to a critical path in the set of critical paths, each split path comprising a fine delay section, an edge detector, and at least one simulated delay section;
configuring, in a first split path in the set of split paths, a first simulated delay section and a first fine delay section, a delay of the first fine delay section being adjustable in several steps; and
configuring, in a second split path in the set of split paths, a second simulated delay section and a second fine delay section, a delay of the second fine delay section being adjustable in several steps, the first split path representing a first critical path that is sensitive in a first manner to a change in operating condition and the second split path representing a second critical path that is sensitive in a second manner to a change in operating condition, the second manner being different from the first manner;
the delay of the first fine delay section being adjustable by a different amount as compared to the delay of the second fine delay section in response to a common operating condition change, and adjusting the delay of the first fine delay section by the different amount as compared to the delay of the second fine delay section causes an edge of a pulse to be synchronized between a first edge detector located after the first simulated delay section and a second edge detector located after the second simulated delay section.

2. The method of claim 1, further comprising:
configuring a first coarse delay section in the first split path such that a delay of the first coarse delay section is adjustable in several steps, and each step in adjusting the delay of the first coarse delay section is larger than a step in adjusting the delay of the first fine delay section.

3. The method of claim 1, wherein a first coarse delay section comprising a set of switchable delay components is a part of the first simulated delay section, each switchable delay component being switched to form a step of adjustment in the first coarse delay section.

4. The method of claim 1, further comprising:
configuring a frequency altering component in the first split path; and
configuring the frequency altering component to alter a frequency of the pulse, before passing the pulse through the first simulated delay section.

5. The method of claim 4, further comprising:
configuring the frequency altering component to alter the frequency to match a frequency of a frequency domain in the IC, wherein a first critical path corresponding to the first split path exists in the frequency domain.

6. The method of claim 1, further comprising:
configuring the first fine delay section such that the delay of the first fine delay section is adjustable in several sets of several steps each, each set of several steps comprising steps of a different size.

7. The method of claim 6, further comprising:
configuring a set of fine delay selection components, each fine delay selection component being configured for selecting a corresponding set in the several sets of several steps; and
configuring a calibration selection signal to select one fine delay selection component from the set of fine delay selection components with each unique value of the calibration selection signal.

8. The method of claim 1, wherein a total of a delay of the first simulated delay section and the delay of the first fine delay section equals a total delay of a first critical path that corresponds to the first split path.

9. The method of claim 1, wherein the first simulated delay section and the first fine delay section are each formed using components having similar delay sensitivities.

10. The method of claim 1, wherein a sensitivity of a delay of the first split path in the set of split paths is within a tolerance limit of a sensitivity of a delay of a corresponding first critical path in the set of critical paths, and wherein the sensitivity of the delay of the first split path is different from the sensitivity of a delay of a second split path in the set of split paths.

11. The method of claim 1, further comprising:
configuring a set of path selection components, wherein a path selection component is configured for selecting a corresponding subset of split paths for calibration; and
configuring a calibration selection signal to select one path selection component from the set of path selection components with each unique value of the calibration selection signal.

12. A computer usable program product comprising a computer usable storage device including computer usable code for adjustable delay calibration in a critical path monitor (CPM), the computer usable code comprising:
computer usable code for configuring, in an integrated circuit (IC), the CPM, wherein the IC includes a set of critical paths, wherein the CPM includes a set of split paths, a split path in the set of split paths corresponding to a critical path in the set of critical paths, each split path comprising a fine delay section, an edge detector, and at least one simulated delay section;
computer usable code for configuring, in a first split path in the set of split paths, a first simulated delay section and a first fine delay section;
computer usable code for configuring, in a second split path in the set of split paths, a second simulated delay section and a second fine delay section;
computer usable code for adjusting a delay of the first fine delay section in several steps, the first split path representing a first critical path that is sensitive in a first manner to a change in operating condition and the second split path representing a second critical path that is sensitive in a second manner to a change in operating condition, the second manner being different from the first manner; and
computer usable code for adjusting a delay of the second fine delay section in several steps, wherein the delay of the first fine delay section is adjustable by a different amount as compared to the delay of the second fine delay section in response to a common operating condition change, and wherein adjusting the delay of the first fine delay section by the different amount as compared to the delay of the second fine delay section causes an edge of a pulse to be synchronized between a first edge detector located after the first simulated delay section and a second edge detector located after the second simulated delay section.

13. The computer usable program product of claim 12, further comprising:
computer usable code for configuring a first coarse delay section in the first split path such that a delay of the first coarse delay section is adjustable in several steps, and wherein a step in adjusting the delay of the first coarse delay section is larger than a step in adjusting the delay of the first fine delay section.

14. The computer usable program product of claim 12, wherein a first coarse delay section is a part of the first simulated delay section, and wherein the first coarse delay section comprises a set of switchable delay components, and wherein each switchable delay component is switched to form a step of adjustment in the first coarse delay section.

15. The computer usable program product of claim 12, further comprising:
computer usable code for configuring a frequency altering component in the first split path; and
computer usable code for configuring the frequency altering component to alter a frequency of the pulse, before passing the pulse through the first simulated delay section.

16. The computer usable program product of claim 15, further comprising:
computer usable code for configuring the frequency altering component to alter the frequency to match a frequency of a frequency domain in the IC, wherein a first critical path corresponding to the first split path exists in the frequency domain.

17. The computer usable program product of claim 12, further comprising:
computer usable code for configuring the first fine delay section such that the delay of the first fine delay section is adjustable in several sets of several steps each, each set of several step comprising steps of a different size.

18. The computer usable program product of claim 12, wherein the computer usable code is stored in a computer readable storage medium in a data processing system, and wherein the computer usable code is transferred over a network from a remote data processing system.

19. The computer usable program product of claim 12, wherein the computer usable code is stored in a computer readable storage medium in a server data processing system, and wherein the computer usable code is downloaded over a network to a remote data processing system for use in a computer readable storage medium associated with the remote data processing system.

20. A critical path monitor (CPM) apparatus with adjustable delay calibration in an integrated circuit (IC), the apparatus comprising:

a set of split paths, a split path in the set of split paths comprising hardware components and corresponding to a critical path in a set of critical paths in the IC;
a first simulated delay section and a first fine delay section in a first split path in the set of split paths;
a second simulated delay section and a second fine delay section in a second split path in the set of split paths, the first split path representing a first critical path in the set of split paths, the first split path being sensitive in a first manner to a change in operating condition and the second split path representing a second critical path in the set of split paths, the second split path being sensitive in a second manner to a change in operating condition, the second manner being different from the first manner;
a configuration in the first fine delay section such that a delay of the first fine delay section is adjustable in several steps; and
a configuration in the second fine delay section such that a delay of the second fine delay section is adjustable in several steps, wherein the delay of the first fine delay section is adjustable by a different amount as compared to the delay of the second fine delay section in response to a common operating condition change, and wherein adjusting the delay of the first fine delay section by the different amount as compared to the delay of the second fine delay section causes an edge of a pulse to be synchronized between a first edge detector located after the first simulated delay section and a second edge detector located after the second simulated delay section.

* * * * *